(12) United States Patent
Stiens et al.

(10) Patent No.: US 10,214,810 B2
(45) Date of Patent: Feb. 26, 2019

(54) TIALCN LAYERS WITH LAMELLAR STRUCTURE

(71) Applicant: Walter AG, Tübingen (DE)

(72) Inventors: Dirk Stiens, Tübingen (DE); Thorsten Manns, Tübingen (DE); Sakari Ruppi, Portimao (PT)

(73) Assignee: Walter AG, Tübingen (DE)

( * ) Notice: Subject to any disclaimer, the term of this patent is extended or adjusted under 35 U.S.C. 154(b) by 180 days.

(21) Appl. No.: 15/112,899

(22) PCT Filed: Mar. 3, 2015

(86) PCT No.: PCT/EP2015/054450
§ 371 (c)(1),
(2) Date: Jul. 20, 2016

(87) PCT Pub. No.: WO2015/135802
PCT Pub. Date: Sep. 17, 2015

(65) Prior Publication Data
US 2016/0333473 A1    Nov. 17, 2016

(30) Foreign Application Priority Data
Mar. 11, 2014  (DE) .................. 10 2014 103 220

(51) Int. Cl.
*B23B 27/14*  (2006.01)
*C23C 16/36*  (2006.01)
(Continued)

(52) U.S. Cl.
CPC ............ *C23C 16/36* (2013.01); *B23B 27/148* (2013.01); *C23C 16/34* (2013.01); *C23C 16/403* (2013.01);
(Continued)

(58) Field of Classification Search
USPC ............ 427/249.17, 249.19, 255.28, 255.32, 427/255.36, 255.392; 428/216, 336, 697,
(Continued)

(56) References Cited

U.S. PATENT DOCUMENTS 6,033,768 A    3/2000  Muenz et al.
6,040,012 A    3/2000  Anderbouhr et al.
(Continued)

FOREIGN PATENT DOCUMENTS

DE     69805924 T2      1/2003
DE     102005032860 A1  1/2007
(Continued)

OTHER PUBLICATIONS

Pitonak et al "Novel TiAlN Coating by Medium Temperature Low Pressure CVD" 18th Plansee Seminar, Reutte HM37 p. 1-12.*
(Continued)

*Primary Examiner* — Archene A Turner
(74) *Attorney, Agent, or Firm* — Morgan, Lewis & Bockius LLP

(57) ABSTRACT

A tool has a main part of hard metal, cermet, ceramic, steel, high-speed steel, and a single or multilayer wear protection coating applied onto the main part by CVD and which has a thickness from 3 μm to 25 μm. The wear protection coating has at least one $Ti_{1-x}Al_xC_yN_z$ layer with stoichiometric coefficients $0.70 \leq x < 1.0$, $y < 0.25$ and $0.75 \leq z < 1.15$ and a thickness from 1.5 μm to 17 μm. The $Ti_{1-x}Al_xC_yN_z$ layer has a lamellar structure with lamellae with thickness of no more than 150 nm, preferably no more than 100 nm, particularly preferably no more than 50 nm. Lamellae are made of periodically alternating regions of the $Ti_{1-x}Al_xC_yN_z$ layer with alternatingly different stoichiometric proportions of Ti and Al, having the same crystal structure (crystallographic phase), and the $Ti_{1-x}Al_xC_yN_z$ layer has at least 90% vol. % of face centered cubic (fcc) crystal structure.

26 Claims, 3 Drawing Sheets

(51) Int. Cl.
*C23C 16/34* (2006.01)
*C23C 16/40* (2006.01)
*C23C 16/455* (2006.01)
*C23C 16/46* (2006.01)

(52) U.S. Cl.
CPC ........ *C23C 16/45502* (2013.01); *C23C 16/46* (2013.01); *B23B 2222/16* (2013.01); *B23B 2222/84* (2013.01); *B23B 2226/18* (2013.01); *B23B 2228/04* (2013.01); *B23B 2228/105* (2013.01)

(58) Field of Classification Search
USPC .............................. 428/698, 699; 51/307, 309
See application file for complete search history.

(56) References Cited

U.S. PATENT DOCUMENTS

| | | | |
|---|---|---|---|
| 7,727,621 B2 * | 6/2010 | Nordlof | C22C 29/08 |
| | | | 428/697 |
| 7,767,320 B2 | 8/2010 | Endler | |
| 8,257,841 B2 | 9/2012 | Endler et al. | |
| 8,389,134 B2 | 3/2013 | Van Den Berg et al. | |
| 8,394,513 B2 | 3/2013 | Van Den Berg et al. | |
| 8,409,696 B2 * | 4/2013 | Johansson | B23B 27/14 |
| | | | 428/216 |
| 8,702,912 B2 | 4/2014 | Tabersky et al. | |
| 8,748,016 B2 | 6/2014 | Endler et al. | |
| 9,976,213 B2 | 5/2018 | Stiens et al. | |
| 2002/0000598 A1 | 1/2002 | Kang et al. | |
| 2007/0289609 A1 | 12/2007 | Lim et al. | |
| 2009/0074521 A1 | 3/2009 | Larsson et al. | |
| 2009/0123779 A1 | 5/2009 | Endler | |
| 2009/0274899 A1 | 11/2009 | Sundstrom et al. | |
| 2011/0003126 A1 | 1/2011 | Van Den Berg et al. | |
| 2015/0064452 A1 | 3/2015 | Pitonak et al. | |
| 2016/0040285 A1 * | 2/2016 | Tatsuoka | C23C 16/36 |
| | | | 407/119 |

FOREIGN PATENT DOCUMENTS

| | | | |
|---|---|---|---|
| DE | 102007000512 B3 | | 1/2009 |
| DE | 112012003571 T5 | | 6/2014 |
| EP | 0496516 A1 | | 7/1992 |
| EP | 0709483 | * | 5/1996 |
| JP | 2001-341008 A | | 12/2001 |
| JP | 2006-281363 A | | 10/2006 |
| JP | 2008-545063 A | | 12/2008 |
| JP | 2010-207920 A | | 9/2010 |
| JP | 2011-513594 A | | 4/2011 |
| JP | 2013-510946 A | | 3/2013 |
| JP | 2014-024130 A | | 2/2014 |
| JP | 2016-522323 A | | 7/2016 |
| WO | 2009/112115 A1 | | 9/2009 |
| WO | 2009/112116 A1 | | 9/2009 |
| WO | 2009/112117 A1 | | 9/2009 |
| WO | 2009/127344 A1 | | 10/2009 |
| WO | 2012/126030 A1 | | 9/2012 |
| WO | 2013/031915 A1 | | 3/2013 |
| WO | 2013/134796 A1 | | 9/2013 |

OTHER PUBLICATIONS

Endlet et al "Aluminium-rich TiAlN coatings by Low Pressure CVD" SUrface & Coatings Tech 205 (2010) p. 1307-1312.*
Keckes et al., "Self-organized periodic soft-hard nanolamellae in polycrystalline TiAlN thin films", Elsevier, Thin Solid Films 545, 2013, pp. 29-32.
International Search Report and Written Opinion dated Jun. 5, 2015 for International Application No. PCT/EP2015/054450.
German Search Report in 10 2014 103 220.9 dated Nov. 27, 2014.
International Preliminary Report on Patentability dated Sep. 13, 2016, for International Application No. PCT/EP2015/054450.
Office Action dated Oct. 30, 2018, issued in corresponding Japanese Patent Application No. 2016-551749.

* cited by examiner (A)            (B)

(A)

(B)

(C)

(D)

TIALCN LAYERS WITH LAMELLAR STRUCTURE

RELATED APPLICATION DATA

The present application is a U.S. National Phase Application of International Application No. PCT/EP2015/054450, filed 3 Mar 2015, which claims priority to German Application No. 10 2014 103 220.9, filed 11 Mar 2014.

SUBJECT-MATTER OF THE INVENTION

The invention concerns a tool having a base body of carbide, cermet, ceramic, steel or high speed steel and a single-layer or multi-layer wear-protection coating applied thereto in a CVD process and of a thickness in the range of 3 μm to 25 μm, wherein the wear-protection coating has at least one $Ti_{1-x}Al_xC_yN_z$ layer having stoichiometry coefficients $0.70 \leq x<1$, $0 \leq y<0.25$ and $0.75 \leq z<1.15$, and with a thickness in the range of 1.5 μm to 17 μm. The invention further concerns a process for the production of such a tool.

BACKGROUND OF THE INVENTION

Cutting inserts for material machining, in particular for cutting metal machining, comprise a substrate body of carbide, cermet, ceramic. steel or high speed steel which in most cases is provided with a single-layer or multi-layer carbide coating for improving the cutting and/or wearing properties. The carbide coating comprises mutually superposed layers of monometallic or mixed-metallic carbide phases. Examples of monometallic carbide phases are TiN, TiC, TiCN and $Al_2O_3$. Examples of mixed-metallic phases in which in a crystal one metal is partially replaced by another are TiAlN and TiAlCN. Coatings of the above-indicated kind are applied by CVD processes (chemical vapour phase deposit). PCVD processes (plasma-assisted CVD processes) or PVD processes (physical vapour phase deposit).

It has been found that certain preferential orientations of crystal growth in the deposit in the PVD or CVD process can have particular advantages, in which respect different preferential orientations of given layers of a coating can also be particularly advantageous for different uses of the cutting insert. The preferential orientation of growth is generally specified in relation to the plane of the crystal lattice defined by way of the Miller index and is referred to as the crystallographic texture (for example fibre texture).

WO 2013/134796 discloses a cutting insert which at least region-wise has a coating formed from one or more coating layers, wherein at least one coating layer includes aluminium, titanium and nitrogen and at least partially has lamellae of a lamella thickness of less than 100 mm, wherein the lamellae include alternate first and second portions with different phases, wherein the first portions predominantly or exclusively comprise hard cubic phase and the second portions predominantly or exclusively comprise soft hexagonal phase. In that case the interplay between the succession of a hard cubic phase and a soft hexagonal phase is intended to promote the strength by virtue of the specific configuration of the structure in the nanometer range, the softer hexagonal component predominating. It is found however that layers with components of hexagonal phase have inadequate wear resistance in particular in the milling or turning machining of steel and cast materials, at high cutting speeds.

WO 2012/126030 discloses a cutting insert having a multi-layer coating which has at least one coating layer with $Al_xTi_{1-x}N$ with $x \geq 0.7$, wherein the proportion of cubic $Al_xTi_{1-x}N$ phase is preferably 70 to 80 mol-% and the remaining proportions are formed by hexagonal AlN and cubic TiN. The proportion of hexagonal AlN is preferably more than 12.5 mol-%. The wear resistance of such coatings is also inadequate by virtue of the proportion of hexagonal AlN. It is assumed that the presence of the three stated phases is based on partial breakdown of the cubic $Al_xTi_{1-x}N$ phase into the thermodynamically stable hexagonal AlN and cubic TiN phases and the remaining proportion of cubic $Al_xTi_{1-x}N$ phase is not only thermodynamically but also kinetically unstable, which leads to a further breakdown, thereby resulting in mechanical weakening of the layer.

J Keckes et al "Self-organized periodic soft-hard nanolamellae in polycrystalline TiAlN thin films", Thin Solid Films 545 (2013), pages 29-32, describe polycrystalline $Ti_{0.05}Al_{0.95}N$ layers deposited by means of CVD with periodically alternating cubic TiN and hexagonal AlN nanolamellae within individual crystallites. Kinetically controlled oscillating reactions at the separation surface are proposed as a possible mechanism involved in lamellae formation. The $Ti_{0.05}Al_{0.95}N$ layers were deposited in the MT-CVD process at 800° C. inter alia on carbide substrates. Characterisation of the layers was effected by means of X-ray diffraction (XRD) and conventional and high-resolution transmission electron microscopy (TEM and HR-TEM). The XRD data of the deposited $Ti_{0.05}Al_{0.95}N$ layers showed the presence of both cubic and also hexagonal Ti—Al—N phases. Powder X-ray diffraction analyses of the $Ti_{0.05}Al_{0.95}N$ material and quantitative Rietveld analysis gave proportions by volume of hexagonal AlN (w-AlN), cubic AlN (c-AlN) and cubic TiN (c-TiN) of about 53, 26 and 21%. The hardness of the layer was about 28 GPa. The TEM analysis of cross-sections of the $Ti_{0.05}Al_{0.95}N$ layers on carbide revealed the presence of lamellar periodic structures. By means of HR-TEM and Fourier transform (FFT) it was possible to show that the lamellae have periodically alternating c-TiN and w-AlN, wherein the w-AlN-containing lamellae were about 10 nm in thickness and the c-TiN-containing lamellae were about 3 nm in thickness. With those layers, inadequate wear resistance is also to be encountered because of the high proportion of hexagonal w-AlN phase.

DE 10 2005 032 860 discloses a carbide coating with a layer of face-centred cubic $Ti_{1-x}Al_xN$ with an Al content of $0.75<x<0.93$ and a process for the production thereof.

DE 10 2007 000 512 discloses a carbide coating with a layer of TiAlN which is deposited on a first layer of TiN. TiCN or TiC deposited directly on the substrate, and a bonding layer provided between the two layers, with a phase gradient. The layer of TiAlN has a preferential orientation of crystal growth with respect to the (200) plane of the crystal lattice.

Laid-open specifications WO 2009/112115, WO 2009/112116 and WO 2009/112117A1 disclose TiAlN and TiAlCN layers deposited by means of CVD processes with a high Al proportion and a face-centred cubic lattice, but no crystallographic preferential orientations of crystal growth are described.

TiAlN coatings produced by means of PVD processes, with various crystallographic preferential orientations of crystal growth, are known, but PVD coatings with face-centred cubic lattices of the TiAlN coatings, in contrast to CVD coatings, are restricted to Al contents of less than 67%. TiAlN coatings with a crystallographic preferential orientation of the {200} plane with respect to the growth direction of the crystallites are described as advantageous for metal machining (for example US 2009/0274899. US 2009/0074521 and WO 2009/127344).

OBJECT

The object of the present invention was to provide cutting inserts for cutting metal machining, in particular turning and milling machining of steel or cast materials, which have improved wear resistance over the state of the art and improved resistance to thermal crack formation.

DESCRIPTION OF THE INVENTION

That object is attained by a tool having a base body of carbide, cermet, ceramic, steel or high speed steel and a single-layer or multi-layer wear-protection coating applied thereto in a CVD process and of a thickness in the range of 3 μm to 25 μm, wherein the wear-protection coating has at least one $Ti_{1-x}Al_xC_yN_z$ layer having stoichiometry coefficients $0.70 \leq x < 1$, $0 \leq y < 0.25$ and $0.75 \leq z < 1.15$, and with a thickness in the range of 1.5 μm to 17 μm, characterised in that the $Ti_{1-x}Al_xC_yN_z$ layer has a lamellar structure with lamellae of a thickness of not more than 150 nm, preferably not more than 100 nm, particularly preferably not more than 50 nm, wherein
the lamellae are formed from periodically alternating regions of the $Ti_{1-x}Al_xC_yN_z$ layer with alternately different stoichiometric proportions of Ti and Al, having the same crystal structure (crystallographic phase), and
the $Ti_{1-x}Al_xC_yN_z$ layer has at least 90 vol-% of face-centred cubic (fcc) crystal structure.

The lamellae of periodically alternating regions of the $Ti_{1-x}Al_xC_yN_z$ layer according to the invention with alternately different Ti and Al proportions have the same face-centred cubic (fcc) crystal structure. It was surprisingly found that such a lamellar structure affords markedly higher service lives for the tool in cutting operations than lamellar TiAlN or TiAlCN structures with alternating crystal structures, like for example the lamellar structures known from the state of the art with alternately face-centred cubic and hexagonal crystal structures of the lamellae.

The $Ti_{1-x}Al_xC_yN_z$ layer according to the invention has at least 90 vol-% of face-centred cubic (fcc) crystal structure. If the proportion of $Ti_{1-x}Al_xC_yN_z$ phase with face-centred cubic (fcc) lattice is too low a lower level of wear resistance is observed.

An even higher proportion of $Ti_{1-x}Al_xC_yN_z$ with face-centred cubic (fcc) crystal structure has proven to be advantageous in regard to wear resistance. In a preferred embodiment of the invention therefore the $Ti_{1-x}Al_xC_yN_z$ layer has at least 95 vol-%, preferably at least 98 vol-%, particularly preferably about 100 vol-% of face-centred cubic (fcc) crystal structure.

The crystal morphology of the polycrystalline $Ti_{1-x}Al_xC_yN_z$ layer can be columnar (column-shaped) or equiaxial, the columnar morphology being preferred as it generally has the advantage over the equiaxial morphology that a higher resistance to relief surface wear is observed. There are fewer grain boundaries available in the columnar microstructure parallel to the layer surface, along which the crystallites in the layer can slide or break away with the mechanical loading occurring. Columnar crystals grow with their longitudinal axis substantially perpendicular to the surface of the substrate. The width of the columnar crystals is measured in a direction parallel to the substrate surface, that is to say perpendicular to the crystal growth direction. The width of the crystals is not necessarily uniaxial, but can vary in various directions parallel to the substrate surface. Measurement of the length and width of the crystals is desirably effected by means of scanning electron microscopic recordings (SEM) at a polished cross-section of the layer to be investigated. The width of a crystal is defined as the spacing of two adjacent grain boundaries along a line parallel to the substrate surface, wherein that line extends at a height corresponding to 50% of the thickness of the layer, unless otherwise stated. For the purposes of the present invention the crystal length is defined as the maximum extent of the crystals in the direction perpendicular to the substrate surface although the crystal growth direction does not always extend perfectly perpendicularly to the substrate surface. Statistically that leads to an underdetermination of the measured mean crystal length in relation to the actual mean crystal length.

In a further preferred embodiment of the $Ti_{1-x}Al_xC_yN_z$ layer according to the invention with lamellae comprising periodically alternating regions with alternately different stoichiometric proportions of Ti and Al the regions with other Ti and Al proportions which respectively adjoin below and above a region of the lamellae in the layer growth direction have the same crystallographic orientation. With such a sequence the layer according to the invention has well-pronounced crystallinity with small proportions of grain boundaries or amorphous layer constituents, which results in a higher level of wear resistance.

In a further preferred embodiment of the invention, as stated above, the $Ti_{1-x}Al_xC_yN_z$ layer has a columnar microstructure, wherein the columnar crystallites have an mean length which is at least 0.35 times, preferably at least 0.5 times, particularly preferably at least 0.7 times the thickness of the $Ti_{1-x}Al_xC_yN_z$ layer.

An excessively short mean length of the crystallites in relation to the thickness of the $Ti_{1-x}Al_xC_yN_z$ layer results in an excessively low resistance to relief surface wear.

It is further preferred if the columnar crystallites have a ratio of the mean length to the mean width, measured at 50% of the thickness of the $Ti_{1-x}Al_xC_yN_z$ layer, of at least 2.5, preferably at least 5, particularly preferably at least 7.

If the ratio of the mean length to the mean width of the crystallites is less that also involves the disadvantage of the lower resistance to relief surface wear in machining.

In a further preferred embodiment of the invention the $Ti_{1-x}Al_xC_yN_z$ layer has a preferential orientation of crystal growth with respect to a crystallographic {hkl} plane, characterised by a texture coefficient TC (hkl) >1.5, preferably >2, particularly preferably >3, wherein the texture coefficient TC (hkl) is defined as follows:

$$TC(hkl) = \frac{I(hkl)}{I_0(hkl)} \left[ \frac{1}{n} \sum_{n=1}^{n} \frac{I(hkl)}{I_0(hkl)} \right]^{-1}.$$

wherein
I(hkl) are the intensities of the diffraction reflexes, measured by X-ray diffraction,
$I_0$(hkl) are the standard intensities of the diffraction reflexes of the pure face-centred cubic phase in accordance with PDF chart 00-046-1200,
n is the number of reflexes used for the calculation, and the reflexes (111), (200), (220) and (311) are used for the calculation of TC(hkl),
wherein the preferential orientation of the crystal growth of the $Ti_{1-x}Al_xC_yN_z$ layer is present with respect to the crystallographic {111}-, {200}-, {220}- or {311}-plane, particularly preferably with respect to the crystallographic {111}-plane.

A preferential orientation of crystal growth with respect to a crystallographic {111}-plane has proven to be advantageous in particular in the turning machining of cast materials.

In a further preferred embodiment of the invention the $Ti_{1-x}Al_xC_yN_z$ layer has a preferential orientation of crystal growth with respect to a crystallographic {hkl}-plane, which is characterised in that the maximum of the X-ray diffraction peak of the crystallographic {hkl}-plane, measured by X-ray diffraction diffractometry (XRD) and/or by electron backscatter diffraction (EBSD), is measured within an angle $\alpha=\pm 20$ degrees, preferably within an angle $\alpha=\pm 10$ degrees, particularly preferably within an angle $\alpha=\pm 5$ degrees, quite particularly preferably within an angle $\alpha=\pm 1$ degree, relative to the perpendicular to the surface of the base body, wherein the preferential orientation of the crystal growth of the $Ti_{1-x}Al_xC_yN_z$ layer is present with respect to the crystallographic {111}-, {200}-, {220}- or {311}-plane, particularly preferably with respect to the crystallographic {111}-plane.

What is crucial in that respect is the section through the pole figure of the {hkl}-plane of the fcc $Ti_{1-x}Al_xC_yN_z$ after integration of the intensities over the azimuth angle $\beta$ (angle of rotation about the sample surface normal).

In a further preferred embodiment of the invention the full width at half maximum (FWHM) of at least one of the X-ray diffraction peaks of the crystallographic {111}-, {200}-, {220}- and {311}-planes is $<1°\ 2\theta$, preferably $<0.60°\ 2\theta$, particularly preferably $<0.45°\ 2\theta$, preferably the full width at half maximum (FWHM) of the X-ray diffraction peak of the crystallographic {111}-plane.

An excessively high full width at half maximum (FWHM) of the X-ray diffraction peak of the {111}-plane of the $Ti_{1-x}Al_xC_yN_z$ layer points to smaller grain sizes of the face-centred cubic (fcc) phase or indeed to proportions of amorphous phases. That has proven to be disadvantageous in terms of wear resistance in the tests hitherto.

In a further preferred embodiment of the invention the $Ti_{1-x}Al_xC_yN_z$ layer has a preferential orientation of crystal growth with respect to the crystallographic {111}-plane, which is characterised by a ratio of the intensities of the X-ray diffraction peaks of the crystallographic {111}-plane and the {200}-plane, I{111} and I{200}, in which $I\{111\}/I\{200\}>1+h(\ln h)^2$, preferably $I\{111\}/I\{200\}>1+(h+3)\times(\ln h)^2$, wherein h is the thickness of $Ti_{1-x}Al_xC_yN_z$ layer in "µm".

A ratio $I\{111\}/I\{200\}>1+h\ (\ln h)^2$ or even $>1+(h+3)\times(\ln h)^2$ characterises a particularly strongly pronounced {111} crystallographic preferential orientation of the layer, which has proven to be particularly advantageous in particular in the machining of cast materials.

In a further preferred embodiment of the invention the $Ti_{1-x}Al_xC_yN_z$ layer has stoichiometry coefficients $0.70\leq x<1$, $y=0$ and $0.95\leq z<1.15$, that is to say this involves a pure TiAlN layer. That has the advantage over a TiAlCN layer that a simpler process implementation is generally possible with the batch-wise coating and in particular uniform setting of the layer properties and the layer composition within the coating batch is facilitated. In addition, in the case of TiAlCN layers, it is to be assumed that only limited amounts of carbon are dissolved in the lattice of the cubic phase and excess carbon can be present in amorphous form. With such a composition, depending on the respective area of use, the lower level of hardness of the layer or advantageous tribological properties can be decisive in terms of tool service life.

In a further preferred embodiment of the invention the $Ti_{1-x}Al_xC_yN_z$ layer has a Vickers hardness (HV) >2300 HV, preferably >2750 HV, particularly preferably >3000 HV.

An excessively low Vickers hardness has the disadvantage of the excessively low level of wear resistance. The high Vickers hardness of the layer according to the invention is reached by the process implementation according to the invention, with which cubic $Ti_{1-x}Al_xC_yN_z$ layers are obtained with low and preferably no detectable proportions of softer foreign phases like hexagonal AlN.

In a further preferred embodiment of the invention arranged between the base body and the $Ti_{1-x}Al_xC_yN_z$ layer is at least one further carbide layer of a thickness of 0.05 µm to 7 µm, preferably 0.1 µm to 5 µm, particularly preferably 0.2 µm to 3 µm, selected from a TiN layer, a TiCN layer deposited by means of high temperature CVD (CVD) or medium temperature CVD (MT-CVD), an $Al_2O_3$ layer and combinations thereof. In addition it is preferred if arranged over the $Ti_{1-x}Al_xC_yN_z$ layer is at least one further carbide layer, preferably at least one $Al_2O_3$ layer of the modification $\gamma$-$Al_2O_3$, $\kappa$-$Al_2O_3$ or $\alpha$-$Al_2O_3$, particularly preferably an $\alpha$-$Al_2O_3$ layer, wherein the $Al_2O_3$ layer is deposited by means of high temperature CVD (CVD) or medium temperature CVD (MT-CVD).

The invention also includes a process for the production of the tool according to the invention as described herein wherein for producing the $Ti_{1-x}Al_xC_yN_z$ layer with a lamellar structure a) the body to be coated is placed in a substantially cylindrical CVD reactor designed for an afflux flow of the bodies to be coated with the process gases in a direction substantially radially relative to the longitudinal axis of the reactor, b) two precursor gas mixtures (VG1) and (VG2) are provided, wherein the first precursor gas mixture (VG1) contains 0.005% to 0.2 vol-% $TiCl_4$, 0.025% to 0.5 vol-% $AlCl_3$ and as a carrier gas hydrogen ($H_2$) or a mixture of hydrogen and nitrogen ($H_2/N_2$) and the second precursor gas mixture (VG1) contains 0.1 to 3.0 vol-% of at least one N-donor selected from ammonia ($NH_3$) and hydrazine ($N_2H_4$) and as a carrier gas hydrogen ($H_2$) or a mixture of hydrogen and nitrogen ($H_2/N_2$) and the first precursor gas mixture (VG1) and/or the second precursor gas mixture (VG2) optionally contains a C-donor selected from acetonitrile ($CH_3CN$), ethane ($C_2H_6$), ethene ($C_2H_4$) and ethyne ($C_2H_2$) and mixtures thereof, wherein the total vol-% proportion of N-donor and C-donor in the precursor gas mixtures (VG1, VG2) is in the range of 0.1 to 3.0 vol-%, c) the two precursor gas mixtures (VG1, VG2) are kept separate before passing into the reaction zone and are introduced substantially radially relative to the longitudinal axis of the reactor at a process temperature in the CVD reactor in the range of 600° C. to 850° C. and a process pressure in the CVD reactor in the range of 0.05 to 18 kPa, wherein the volume gas flows ($\dot{V}$) of the precursor gas mixtures (VG1, VG2) are so selected that the mean residence time ($\tau$) in the CVD reactor is less than 1 second.

An essential process measure for achieving the structure according to the invention of the $Ti_{1-x}Al_xC_yN_z$ layer is setting the volume gas flows ($\dot{V}$) of the precursor gas mixtures (VG1, VG2) such that the mean residence time ($\tau$) in the CVD reactor is less than 1 second. Preferably the volume gas flows ($\dot{V}$) of the precursor gas mixtures (VG1, VG2) are so selected that the mean residence time (τ) in the CVD reactor is less than 0.5 second, preferably less than 0.35 second.

If the mean residence time of the volume gas flows ($\dot{V}$) is too long the lamellar structure according to the invention is not certain to be achieved and/or the layers contain an excessively high proportion of hexagonal AlN.

The process according to the invention is preferably carried out at a process temperature in the CVD reactor in the range of 625° C. to 800° C., preferably in the range of 650° C. to 725° C., and/or at a process pressure in the CVD reactor in the range of 0.05 to 8 kPa, preferably in the range of 0.1 to 7 kPa.

If the process temperature in the CVD reactor is too high then high contents of hexagonal AlN are obtained in the layer, whereby inter alia the layer hardness drops. If in contrast the process temperature in the CVD reactor is too low the deposition rate can drop into an uneconomical range. In addition at low temperatures layers with chlorine contents >1 at % and lower hardness are produced.

If the process pressure in the CVD reactor is too high that leads to an irregular layer thickness distribution on the tools with increased layer thickness at the edges, the so-called dogbone effect. In addition frequently high proportions of hexagonal AlN are obtained. A process pressure in the CVD reactor of lower than 0.05 kPa is in contrast technically difficult to achieve. In addition, with an excessively low process pressure, there is no longer any guarantee of uniform coating of the tool.

In a further preferred embodiment of the process according to the invention the ratio of the volume gas flows ($\dot{V}$) of the precursor gas mixtures (VG1, VG2) $\dot{V}$(VG1)/$\dot{V}$(VG2) is less than 1.5, preferably less than 1.25, particularly preferably less than 1.15.

It was surprisingly found that a low ratio of the volume gas flows ($\dot{V}$) of less than 1.5 or even still less makes it possible to achieve a particularly pronounced {111} preferential orientation of crystal growth. If the ratio of the volume gas flows of the precursor gas mixtures (VG1, VG2) is too high then generally a preferential orientation other than the particularly preferred {111} preferential orientation according to the invention is produced.

In accordance with the present invention proportions in vol-% in the precursor gas mixtures relate to the total volume of the gas mixture introduced into the reaction zone and comprising the first and second precursor gas mixtures.

It was surprisingly found that the process implementation according to the invention makes it possible to produce $Ti_{1-x}Al_xC_yN_z$ and $Ti_{1-x}Al_xN_z$ layers with stoichiometry coefficients 0.70≤x<1, 0≤y<0.25 and 0.75≤z<1.15 and with a face-centred cubic lattice, which have a lamellar structure comprising periodically alternating regions which are formed from alternately different stoichiometric proportions of Ti and Al, which have the same crystal structure. In comparison with known coatings with TiAlCN and TiAlN layers, in particular those which comprise alternately face-centred cubic and hexagonal crystal structures of the lamellae, the coatings according to the invention have outstanding properties in metal machining. It was further surprisingly found that, in the case of a cutting insert with a coating of the kind described herein, in cutting metal machining, in particular in turning and milling of steel or cast materials, it is possible to achieve a wear resistance which is improved over known cutting inserts and a wider range of applications.

In the CVD process according to the invention two precursor gas mixtures (VG1) and (VG2) are prepared, wherein the first precursor gas mixture (VG1) contains the metals Ti and Al in the form of their chlorides and carrier gas and the second precursor gas mixture (VG2) contains at least one N-donor. In general only N-donor ammonia ($NH_3$) or hydrazine ($N_2H_4$) is used for the production of a pure TiAlN layer. For the production of the TiAlCN layer N-donor and C-donor are used, for example ammonia ($NH_3$) mixed with ethene ($C_2H_4$). In the process according to the invention acetonitrile ($CH_3CN$) acts predominantly as a C-donor and is accordingly used in the mixture with an N-donor. Depending on the respectively desired stoichiometry it is possible to use mixtures with further N-donors and C-donors. For the process according to the invention it is necessary for the N-donor to be supplied separately from the chlorides of the metals Ti and Al, but in contrast the C-donor can be supplied both by way of the first precursor gas mixture (VG1) and also by way of the second precursor gas mixture (VG2). In a further preferred embodiment of the invention the N-donor is ammonia ($NH_3$).

The CVD process used according to the invention is an MT-CVD process at a process temperature in the CVD reactor in the range of 600° C. to 850° C. and a process pressure in the range of 0.2 to 8 kPa. The CVD reactor is a substantially cylindrical reactor which is designed for an afflux flow to the bodies to be coated with the process gases in a direction substantially radially relative to the longitudinal axis of the reactor, that is to say from the central axis of the cylindrical reactor in the direction of the outer walls of the reactor, that are formed by the cylinder casing. Such cylindrical reactors are known and commercially available, for example the CVD coating systems of type Bernex®BPXpro from Ionbond AG, Olten, Switzerland.

An essential process step in the process according to the invention is that the two precursor gas mixtures (VG1) and (VG2) are kept separate prior to passing into the reaction zone. If that is not done the precursor gas flows can already react excessively early, for example in the supply lines, and the desired coating is not achieved.

DESCRIPTION OF THE FIGURES

FIG. 3A: bright field image; FIG. 3B: HAADF (high angle annular dark field) image. The contrast inversion when changing between the two detector signals is a sign of differences in the chemical composition between the light and dark regions of the lamellae.

DEFINITIONS AND METHODS

Mean Residence Time

Figure 1:
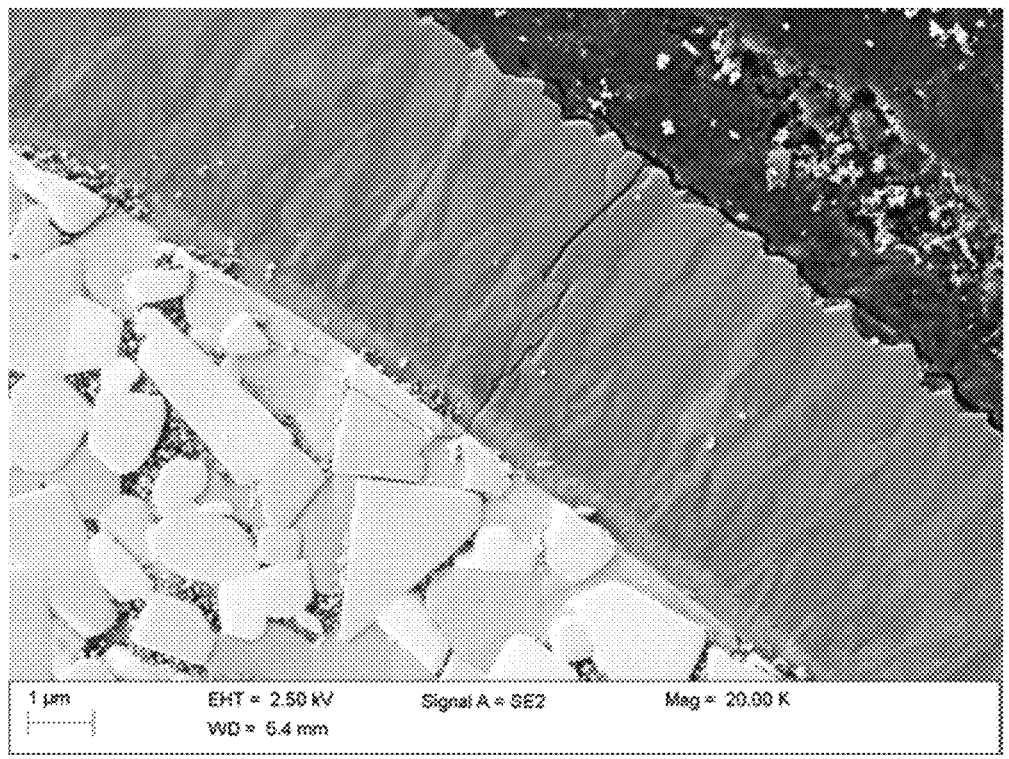
FIG. 1 shows a scanning electron microscope image (SEM) of a layer according to the invention.

The mean residence time τ in the reaction zone of the CVD reactor in accordance with the present invention is defined as the quotient of the reactor volume $V_R$ and the issuing volume gas flow $\dot{V}$ at the process pressure p measured at the reactor outlet:

$$\tau = \frac{V_R}{\dot{V}} = \frac{V_R p}{\dot{V}_N p_N}$$

wherein $\dot{V}_N$ denotes the volume gas glow under normal conditions and $p_N$ is the normal pressure=101.325 Pa. For calculating the mean residence time according to the present application, instead of the total reactor volume, only the volume of the batch constitution in the reactor is used as the volume $V_R$.

X-ray Diffractometry (XRD)

X-ray diffraction measurements were implemented on a diffractometer of type GE Sensing & Inspection Technologies PTS3003 using CuKα radiation. For θ-2θ residual stress and pole figure measurements a parallel beam optical system was used, which at the primary side comprised a polycapillary means and a 2 mm pinhole as a collimator. At the secondary side a parallel plate collimator with 0.4° divergence and a nickel $K_\beta$ filter was used.

Peak intensities and full width at half maximums were determined on the basis of θ-2θ measurements. After deduction of the background pseudo-Voigt functions were fitted to the measurement data, wherein the $K\alpha_2$ deduction was effected by means of $K\alpha_1/K\alpha_2$ doublet matching. The values in respect of intensities and full-width half-maximums set out in Table 4 relate to the $K\alpha_1$ interferences fitted in that way. The lattice constants are calculated in accordance with Vegard's law on the assumption of the lattice constants of TiN and AlN from PDF charts 38-1420 and 00-46-1200 respectively.

Characterisation of Lamellar Structures in $Ti_{1-x}Al_xC_yN_z$ Layers

Detection and characterisation of the existence of lamellar structures in the $Ti_{1-x}Al_xC_yN_z$ layers according to the invention by means X-ray diffraction (XRD) and conventional and high-resolution transmission electron microscopy (TEM and HR-TEM) was effected as described in J Keckes et al "Self-organized periodic soft-hard nanolamellae in polycrystalline TiAlN thin films", Thin Solid Films 545 (2013), pages 29-32. A transmission electron microscope FEI Titan 80-300 with a field emission cathode with an acceleration voltage of 300 kV was used. Scanning transmission electron microscope images were recorded with bright field (BF) and high angle annular dark field (HAADF) detectors. For sample preparation for transmission electron microscopy a combined FIB/SEM system was used (FIB=focused ion beam) which was equipped with a liquid gallium ion source and a field emission cathode as the electron source as well as a system for ion- and electron-supported deposition of Pt. By means of that system polished cross-sections were prepared as lamellae by in-situ lift-out out of the layer and diluted to adequate electron transparency.

Pole Figures

Pole figures of the {111} reflex were implemented at 2θ=38.0° over an angle range of 0°<α<75° (increment 5°) and 0°<β<360° (increment 5°) with a circular arrangement of the measurement points. The intensity distribution of all measured and back-calculated pole figures was approximately rotationally symmetrical, that is to say the layers investigated exhibited fibre textures. For checking the preferential orientation pole figures were measured in addition to the {111} pole figure at the {200} and {220} reflexes. The orientation density distribution function (ODF) was calculated with the software LaboTex3.0 from LaboSoft, Poland, and the preferential orientation represented as an inverse pole figure. With the layers according to the invention the intensity maximum was in the crystallographic direction <hkl> corresponding to the set preferential orientation or at ≤20° angle deviation from <hkl>, wherein <hkl> was equal to <111>, <200>, <220> or <311>, preferably <111>.

EDX Measurements (Energy-dispersive X-ray Spectroscopy)

EDX measurements were carried out on a scanning electron microscope Supra 40 VP from Carl Zeiss with 15 kV acceleration voltage with an EDX spectrometer type INCA x-act from Oxford Instruments, UK.

Microhardness Determination

Measurement of microhardness was effected in accordance with DIN EN ISO 14577-1 and -4 with a universal hardness tester of type Fischerscope H100 from Helmut Fischer GmbH, Sindelfingen, Germany, on a polished section of the coated bodies.

EXAMPLES

Example 1

Production of Coated Carbide Indexable Cutting Bits

In these examples the substrate bodies used are carbide indexable cutting bits of the geometry SEHW1204AFN with a composition of 90.5 wt-% WC, 8 wt-% Co and 1.5 wt-% (NbC+TaC) and with a mixed-carbide-free edge zone.

For coating the carbide indexable cutting bits a CVD coating installation of the type Bernex BPX325S with a reactor height of 1250 mm, a reactor diameter of 325 mm and a volume of the charge constitution of 40 liters was used. The gas flow was radially relative to the longitudinal axis of the reactor.

For bonding the $Ti_{1-x}Al_xC_yN_z$ layers according to the invention and the comparative layers a TiN layer approximately 0.3 μm in thickness was firstly directly applied to the carbide substrate by means of CVD under the deposit conditions set out in Table 1.

TABLE 1

Reaction conditions in the production of the bonding layer

| Bonding layer | Temp. [° C.] | Pressure [kPA] | Time [min] | Reactive gas mixture vol [%] | | |
|---|---|---|---|---|---|---|
| | | | | TiCl$_4$ | N$_2$ | H$_2$ |
| TiN | 850 | 15 | 90 | 1.0 | 44.00 | 55.0 |

To produce the $Ti_{1-x}Al_xC_yN_z$ layers according to the invention a first precursor gas mixture (VG1) with the starting compounds TiCl$_4$ and AlCl$_3$ and a second precursor gas mixture (VG2) with the starting compound NH$_3$ as the reactive nitrogen compound were introduced into the reactor separately from each other so that mixing of the two gas flows took place only upon passing into the reaction zone. The volume gas flows of the precursor gas mixtures (VG1) and (VG2) were so set that a mean residence time τ of the reaction gas in the reactor and an overall volume flow under normal conditions $\dot{V}_N$ was achieved. The parameters in the production of the $Ti_{1-x}Al_xC_yN_z$ coating 1) according to the invention and the comparative coating 2) are reproduced in Table 2.

TABLE 2

Reaction conditions in the production of $Ti_{1-x}Al_xC_yN_z$ coatings

| # layer | Temp. [° C.] | Pressure [kPA] | Time [min] | Total volume flow $\dot{V}_N$ [l$_N$/min] | τ [sec] | Precursor gas mixture (VG1) | | | Precursor gas mixture (VG2) | |
|---|---|---|---|---|---|---|---|---|---|---|
| | | | | | | TiCl$_4$ | AlCl$_3$ | H$_2$ | H$_2$ | NH$_3$ |
| 1) TiAlN (inv.) | 670 | 1.2 | 260 | 107 | 0.27 | 0.03 | 0.23 | 52.5 | 46.9 | 0.35 |
| 2) TiAlN (comp.) | 670 | 1.2 | 260 | 25 | 1.14 | 0.03 | 0.23 | 52.5 | 46.9 | 0.35 |

X-ray diffraction (XRD), electron diffraction, in particular EBSD, scanning electron microscopy (SEM), scanning transmission electron microscopy (STEM) and transmission electron microscopy (TEM) as well as microhardness measurement were used to characterise the $Ti_{1-x}Al_xC_yN_z$ layers according to the invention.

The layer thickness of the $Ti_{1-x}Al_xC_yN_z$ layer 1) according to the invention was 4.5 μm and the layer thickness of the comparative layer 2) was 6.25 μm. The microhardness of the layer 1) according to the invention was 3070 $HV_{0.05}$ while the microhardness of the comparative coating 2) was measured at 2300 $HV_{0.05}$.

The XRD analysis showed that the layer 1) according to the invention substantially comprised pure face-centred cubic (fcc) phase and had a strong {111} preferential orientation of crystal growth. The full width at half maximums of the {111} reflex was 0.64° 2θ and the composition of the layer could be determined as about $Ti_{0.195}Al_{0.805}N_{1.05}$.

The comparative coating 2) showed in the XRD analysis wide signals in the range of 30°≤2θ≤40° which were fitted by the software used as two peaks (2θ=36.98°, FWHM=1.28° and 2θ=37.83°, FWHM=0.94°). The large peak width points to a fine-crystalline structure. The composition of the layer was around $Ti_{0.3}Al_{0.17}N_{1.0}$. It was not possible to uniquely determine on the basis of the diffractogram the components to which the XRD signal was to be attributed to the {101} interference of hexagonal AlN and to the {111} reflex of cubic $Ti_{1-x}Al_xN_z$. It is however to be assumed that significant proportions of hexagonal AlN are present in the layer. As the layer interferences with the highest intensity occur in the angle range 30°≤2θ≤40° it is possible to conclude that there is a {111} preferential orientation of the cubic component of the $Ti_{1-x}Al_xC_yN_z$ layer.

The {101}- and {202}-interferences of hexagonal AlN and the {111}- and {222}-reflections of cubic $Ti_{1-x}Al_xC_yN_z$ can be more or less greatly superimposed depending on the respective chemical composition. Only the interference of the {200}-plane of the cubic $Ti_{1-x}Al_xC_yN_z$ is superimposed by no further interferences, like for example due to the substrate body or layers arranged thereover or therebeneath, and has the highest intensity for random orientation.

Therefore measurements (θ-2θ scans) were carried out at two different tilt angles ψ (ψ=0° and ψ=54.74°) to assess the volume proportion of hexagonal AlN in the measurement volume and to avoid misinterpretations in respect of the {111}- and {200} intensities of the cubic $Ti_{1-x}Al_xC_yN_z$. As the angle between the plane normals of {111} and {200} is about 54.74° then with a strong {111} fibre texture there is an intensity maximum of the {200} reflex at the tilt angle ψ=54.74° while the intensity of the {111} reflex tends towards zero. Conversely with the tilt angle ψ=4.74° a strong intensity maximum of the {111-reflex is obtained with a strong {200} fibre texture while the intensity of the {200} reflex tends towards zero.

In that way, for the $Ti_{1-x}Al_xC_yN_z$ layers produced, a check was made to ascertain whether the measured intensity at 2θ≈38.1° is predominantly to be associated with the face-centred cubic $Ti_{1-x}Al_xC_yN_z$ phase or whether greater proportions of hexagonal AlN are contained in the layer. Both X-ray diffraction measurements and also EBSD measurements conformingly revealed only very small proportions of hexagonal AlN phase in the layers according to the invention. The chemical composition of the $Ti_{1-x}Al_xC_yN_z$ layer 1) according to the invention was around $Ti_{0.19}Al_{0.81}N$, which on the basis of the position of the {111} peak in accordance with Vegard's law and using the corresponding {111} peak positions for pure fcc TiN in accordance with PDF chart 38-1420 and pure fcc AlN in accordance with PDF chart 46-1200 was calculated as reference values.

Cross-sections of the $Ti_{1-x}Al_xC_yN_z$ layers according to the invention were investigated by means of scanning electron microscopy (SEM), scanning transmission electron microscopy (STEM) and transmission electron microscopy (TEM). The layer 1) according to the invention consisted of columnar crystallites of a typical length near the layer thickness of about 3-4 μm and a mean width, measured at 50% of the thickness of the $Ti_{1-x}Al_xC_yN_z$ layer, of about 200 nm. The length-to-width ratio was thus about 17.5. Scanning electron microscope images (SEM) of a polished cross-section of the comparative layer 2) revealed a fine structure in which it was not possible to see any discrete crystallites. No lamellae structure could be found in the layer.

Figure 2:
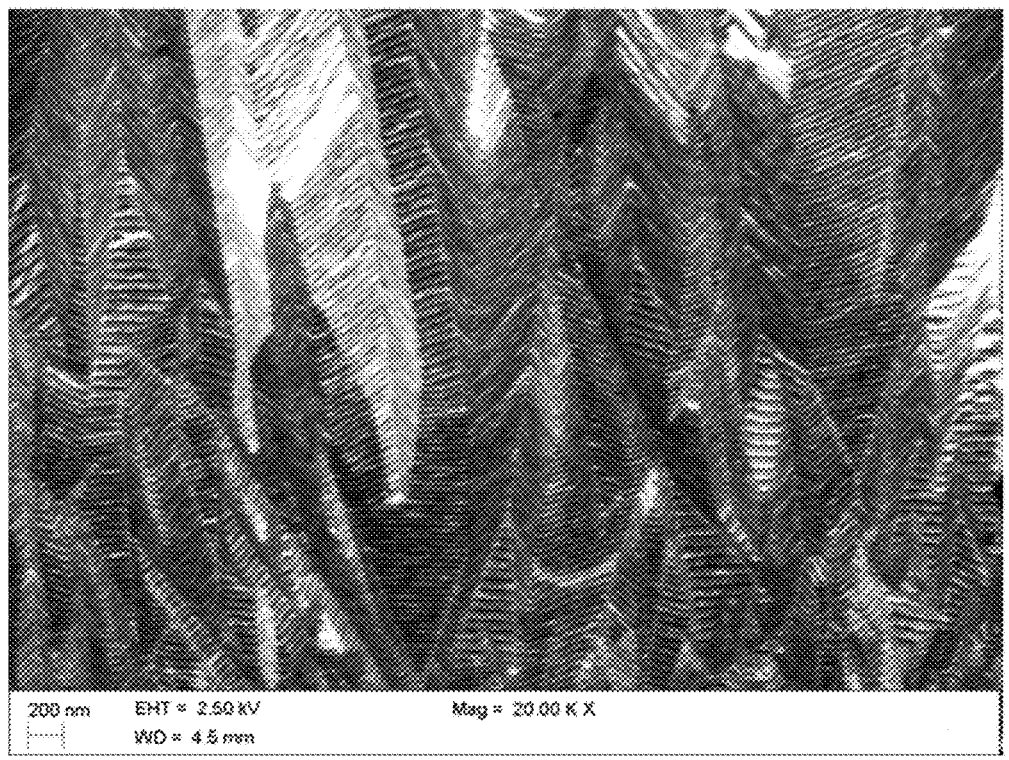
FIG. 2 shows a further scanning electron microscope image (SEM) of the layer according to the invention as shown in FIG. 1 at higher magnification. It is possible to see in the image with an InLEns-SE detector that the lamellae structure extends substantially over the entire layer.

FIGS. 1 and 2 show scanning electron microscope images (SEM) of the layer 1) according to the invention.

Figure 3:
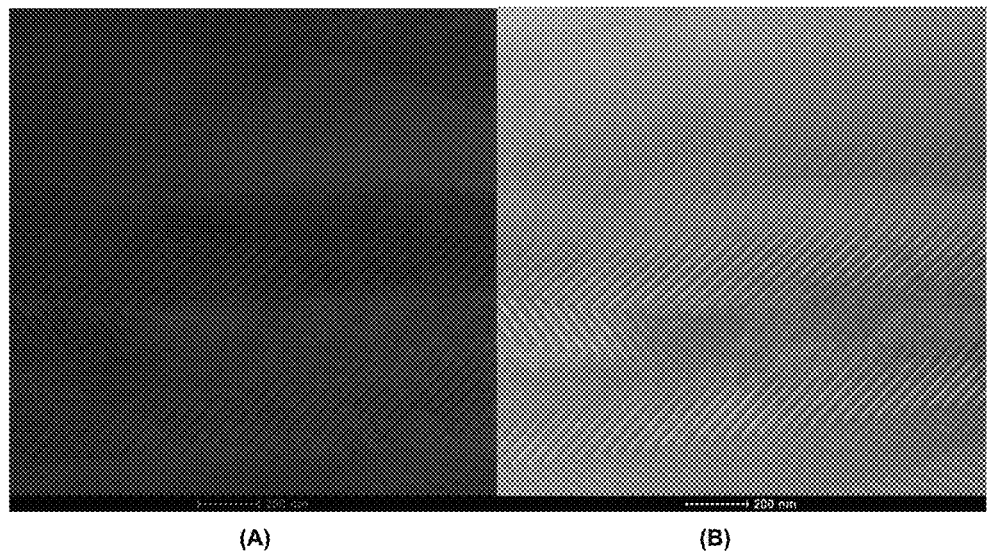
FIG. 3 shows STEM images of the layer according to the invention as shown in FIGS. 1 and 2.

FIG. 3 shows STEM images of the layer 1) according to the invention in the bright field mode (BF) (FIG. 3A) and in the high angle annular dark field (HAADF) dark field mode (FIG. 3B). The lamellar structure according to the invention is to be clearly seen in all crystallites, wherein the sharpness of the contrast depends on the orientation of the crystallites relative to the electron beam. The thickness of the lamellae is about 30 nm. The images in FIG. 3 were taken approximately at the centre of the layer but the columnar crystallites with a lamellar structure were observed in the entire layer. The direction of layer growth is from left to right in the images in FIG. 3. In the crystallites which exhibit the highest contrast regions of differing thicknesses are to be seen within the lamellae structure. It was possible to show by EDS analysis that the narrower regions of the lamellae which appear dark in the BF and bright in the HAADF have higher Ti proportions and lower Al proportions than the wider regions. The nitrogen proportion however was of equal magnitude within the measurement accuracy in the various regions. The overall composition determined by means of EDS is the same as the overall composition determined by XRD.

Figure 4:
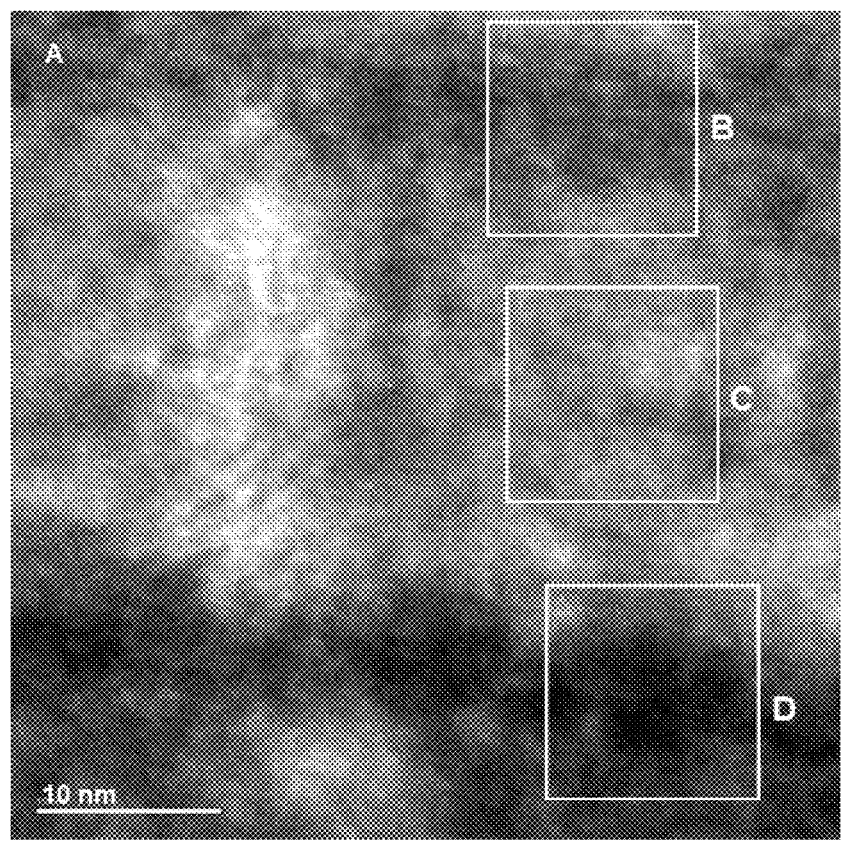
FIG. 4 shows a high-resolution HRTEM image of the lamellar structure of the layer according to the invention as shown in FIGS. 1 and 2.
Figure 5:
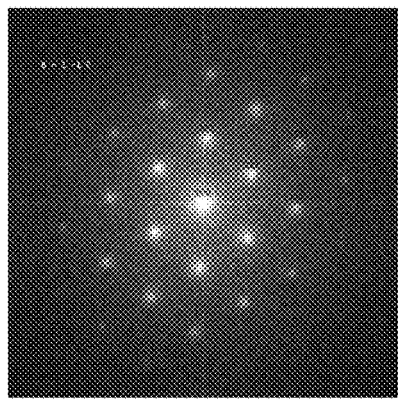
FIG. 5 shows Fourier transforms of the overall image of FIG. 4 (FIG. 5(A)) and portions from FIG. 4 (FIGS. 5(B), 5(C) and 5(D)).
Figure 5:
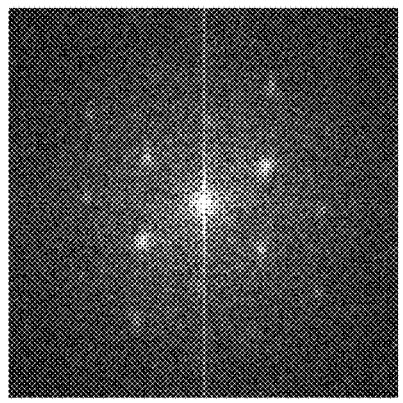
Figure 5:
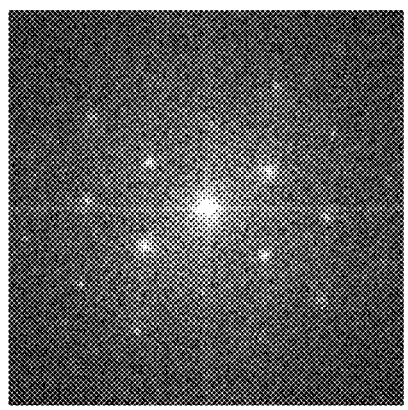
Figure 5:
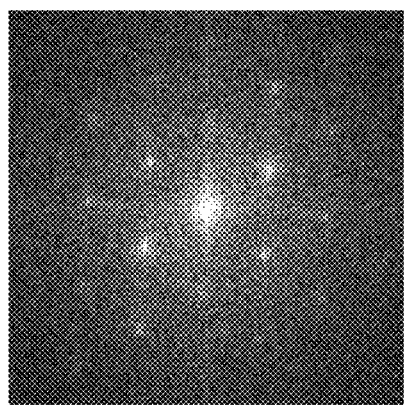

FIG. 4 shows a high-resolution HRTEM image of the lamellar structure of the layer 1) according to the invention. It is possible to see two lamellae regions, wherein the narrower regions with a higher Ti content are to be seen as dark bands in the upper and lower regions in FIG. 4. Fourier transform operations were conducted in respect of the three regions (B, C, D) of the image shown in FIG. 4, that are marked by square outlines in FIG. 4. They are reproduced in FIG. 5 as FIGS. 5(B), 5(C) and 5(D). The squares B and D in FIG. 4 (corresponding to FIGS. 5(B) and 5(D)) cover the narrower regions which have a higher Ti content, whereas the square C in FIG. 4 (corresponding to FIG. 5(C)) covers a wider region which has a higher Al content. FIG. 5(A) shows the Fourier transform of the whole of FIG. 4.

The Fourier transforms of FIG. 5 show that the entire structure comprises face-centred cubic (fcc) phase. Within the accuracy of the method the lattice constant determined on the basis of the patterns of Fourier transforms of 4.04 Å is in conformity with the lattice constant determined by XRD of 4.08 Å. In addition FIGS. 5(B), 5(C) and 5(D) show that the same crystal structure (fcc) and the same orientation prevail in the three different regions, covered by those Figures, of the lamellar structure.

Example 2

Cutting Trials

The carbide indexable cutting bits produced in accordance with Example 1 with the TiAlN layer 1) according to the invention and the comparative layer 2) respectively as well as a carbide indexable cutting bit of a commercially available kind from a competitor were used for milling cast materials. The competitor tool had a multi-layer coating involving the layer sequence TiN (0.5 μm)-TiCN (2 μm)-TiAlN (3 μm), wherein the TiAlN layer in accordance with XRD analysis solely consisted of a phase mixture of hexagonal AlN and cubic $Ti_{1-x}Al_xN_z$. A two-phase structure with partial formation of lamellae could be seen in SEM images, similarly to the structure described in WO 2013/134796.

Milling operations were carried out under the following cutting conditions with the cutting inserts:
Workpiece material: grey cast iron GGG70
Co-directional, dry machining
Tooth feed: $f_z$=0.2 mm
Cutting depth: $a_p$=3 mm
Cutting speed: $v_c$=283 m/min
Setting angle: κ=45°
Working engagement: $a_e$=98 mm
Projection: $u_e$=5 mm.

Then the maximum wear mark width $v_{B,max}$ at the main cutting edge was determined after 4000 m of milling travel:

| Tool | Wear mark width $v_{B,\ max}$ [mm] | Number of comb cracks |
|---|---|---|
| 1) (invention) | 0.20 | 1 |
| 2) (comparative example) | 0.39 | 6 |
| Comparative tool (competition) | 0.35 | 4 |

The invention claimed is:

1. A tool comprising a base body of carbide, cermet, ceramic, steel or high speed steel, and a single-layer or multi-layer wear-protection coating applied thereto in a CVD process and of a thickness in the range of 3 μm to 25 μm,
wherein the wear-protection coating has at least one $Ti_{1-x}Al_xC_yN_z$ layer having stoichiometry coefficients 0.70<x<1, 0<y<0.25 and 0.75<z<1.15, and with a thickness in the range of 1.5 μm to 17 μm,
wherein the $Ti_{1-x}Al_xC_yN_z$ layer has a lamellar structure with lamellae of a thickness of not more than 150 nm,
wherein the lamellae are formed from periodically alternating regions of the $Ti_{1-x}Al_xC_yN_z$ layer with alternately different stoichiometric proportions of Ti and Al, having the same crystal structure (crystallographic phase), and
wherein the $Ti_{1-x}Al_xC_yN_z$ layer has at least 90 vol-% of face-centred cubic (fcc) crystal structure.

2. A tool according to claim 1, wherein the $Ti_{1-x}Al_xC_yN_z$ layer has at least 95 vol-% of face-centred cubic (fcc) crystal structure.

3. A tool according to claim 1, wherein in the $Ti_{1-x}Al_xC_yN_z$ layer with lamellae comprising periodically alternating regions with alternately different stoichiometric proportions of Ti and Al regions with other Ti and Al proportions which respectively adjoin below and above a region of the lamellae in the layer growth direction have the same crystallographic orientation.

4. A tool according to claim 1, wherein the $Ti_{1-x}Al_xC_yN_z$ layer has a columnar microstructure,
wherein the columnar crystallites have a mean length which is at least 0.35 times the thickness of the $Ti_{1-x}Al_xC_yN_z$ layer, and/or
wherein the columnar crystallites have a ratio of the mean length to the mean width, measured at 50% of the thickness of the $Ti_{1-x}Al_xC_yN_z$ layer, of at least 2.5.

5. A tool according to claim 4, wherein the mean length of the columnar crystallites is at least 0.5 times the thickness of the $Ti_{1-x}Al_xC_yN_z$ layer.

6. A tool according to claim 4, wherein the ratio of the mean length to the mean width of the columnar crystallites, measured at 50% of the thickness of the $Ti_{1-x}Al_xC_yN_z$ layer, is at least 5.

7. A tool according to claim 1, wherein the $Ti_{1-x}Al_xC_yN_z$ layer has a preferential orientation of crystal growth with respect to a crystallographic {hkl} plane, characterised by a texture coefficient TC (hkl)>1.5,
wherein the texture coefficient TC (hkl) is defined as follows:

$$TC(hkl) = \frac{I(hkl)}{I_0(hkl)} \left[ \frac{1}{n} \sum_{n=1}^{n} \frac{I(hkl)}{I_0(hkl)} \right]^{-1},$$

wherein
l(hkl) are the intensities of the diffraction reflexes, measured by X-ray diffraction,
lo(hkl) are the standard intensities of the diffraction reflexes in accordance with PDF chart 00-046-1200,
n is the number of reflexes used for the calculation, and the reflexes (111), (200), (220) and (311) are used for the calculation of TC(hkl), and
wherein the preferential orientation of the crystal growth of the $Ti_{1-x}Al_xC_yN_z$ layer is present with respect to the crystallographic {111}-, {200}-, {220}- or {311}-plane.

8. A tool according to claim 1, wherein the $Ti_{1-x}Al_xC_yN_z$ layer has stoichiometry coefficients $0.70 \leq x < 1, y = 0$ and $0.95 \leq z < 1.15$.

9. A tool according to claim 7, wherein the preferential orientation of the crystal growth of the $Ti_{1-x}Al_xC_yN_z$ layer is present with respect to the crystallographic {111}-plane.

10. A tool according to claim 1, wherein the $Ti_{1-x}Al_xC_yN_z$ layer has a preferential orientation of crystal growth with respect to a crystallographic {hkl}-plane, which is characterised in that the maximum of the X-ray diffraction peak of the crystallographic {hkl}-plane, measured by X-ray diffraction diffractometry (XRD) and/or by electron backscatter diffraction (EBSD), is measured within an angle a $\alpha = \pm 20$ degrees relative to the perpendicular to the surface of the base body,
wherein the preferential orientation of the crystal growth of the $Ti_{1-x}Al_xC_yN_z$ layer is present with respect to the crystallographic {111}-, {200}-, {220}- or {311}-plane.

11. A tool according to claim 10, wherein the maximum of the X-ray diffraction peak of the crystallographic {hkl}-plane, measured by X-ray diffraction diffractometry (XRD) and/or by electron backscatter diffraction (EBSD), is measured within an angle $\alpha = +10$ degrees relative to the perpendicular to the surface of the base body.

12. A tool according to claim 10, wherein the preferential orientation of the crystal growth of the $Ti_{1-x}Al_xC_yN_z$ layer is present with respect to the crystallographic {111}-plane.

13. A tool according to claim 1, wherein the full width at half maximum (FWHM) of at least one of the X-ray diffraction peaks of the crystallographic {111}-, {200}-, {220}- and {311}-planes is $<1° \ 2\theta$.

14. A tool according to claim 13, wherein the full width at half maximum (FWHM) of at least one of the X-ray diffraction peaks of the crystallographic {111}-, {200}-, {220}- and {311}-planes is $<0.6° \ 2\theta$.

15. A tool according to claim 13, wherein the full width at half maximum (FWHM) of the X-ray diffraction peaks of the crystallographic {111}-plane is $<1° \ 2\theta$.

16. A tool according to claim 1, wherein the $Ti_{1-x}Al_xC_yN_z$ layer has a preferential orientation of crystal growth with respect to the crystallographic {111}-plane, which is characterised by a ratio of the intensities of the X-ray diffraction peaks of the crystallographic {111}-plane and the {200}-plane, $I\{111\}$ and $I\{200\}$, in which $I\{111\}/I\{200\} > 1 + h(\ln h)^2$, wherein h is the thickness of $Ti_{1-x}Al_xC_yN_z$ layer in "μm".

17. A tool according to claim 16, wherein $I\{111\}/I\{200\} > 1 + (h+3) \times (\ln h)^2$.

18. A tool according to claim 7, wherein the texture coefficient TC (hkl) is greater than 2.

19. A tool according to claim 1, wherein the $Ti_{1-x}Al_xC_yN_z$ layer has a Vickers hardness (HV) $>2300$ HV.

20. A tool according to claim 1, further comprising, arranged between the base body and the $Ti_{1-x}Al_xC_yN_z$ layer, at least one further carbide layer of a thickness of 0.05 μm to 7 μm, selected from a TiN layer, a TiCN layer deposited by means of high temperature CVD (CVD) or medium temperature CVD (MT-CVD), an $Al_2O_3$ layer and combinations thereof and/or arranged over the $Ti_{1-x}Al_xC_yN_z$ layer is at least one further carbide layer.

21. A process for the production of a tool according to claim 1, wherein, for producing the $Ti_{1-x}Al_xC_yN_z$ layer with a lamellar structure, the process comprises:

a) placing the body to be coated in a substantially cylindrical CVD reactor designed for an afflux flow of the bodies to be coated with the process gases in a direction substantially radially relative to the longitudinal axis of the reactor, b) providing two precursor gas mixtures (VG1) and (VG2), wherein the first precursor gas mixture (VG1) contains 0.005% to 0.2 vol-% $TiCl_4$, 0.025% to 0.5 vol-% $AlCl_3$ and as a carrier gas hydrogen ($H_2$) or a mixture of hydrogen and nitrogen ($H_2/N_2$) and the second precursor gas mixture (VG2) contains 0.1 to 3.0 vol-% of at least one N-donor selected from ammonia ($NH_3$) and hydrazine ($N_2H_4$) and as a carrier gas hydrogen ($H_2$) or a mixture of hydrogen and nitrogen ($H_2/N_2$) and the first precursor gas mixture (VG1) and/or the second precursor gas mixture (VG2) optionally contains a C-donor selected from acetonitrile ($CH_3CN$), ethane ($C_2H_6$), ethene ($C_2H_4$) and ethyne ($C_2H_2$) and mixtures thereof, wherein the total vol-% proportion of N-donor and C-donor in the precursor gas mixtures (VG1VG2) is in the range of 0.1 to 3.0 vol-%, c) maintaining the two precursor gas mixtures (VG1, VG2) separate before passing into the reaction zone and introducing the two precursor gas mixtures (VG1, VG2) substantially radially relative to the longitudinal axis of the reactor at a process temperature in the CVD reactor in the range of 600° C. to 850° C. and a process pressure in the CVD reactor in the range of 0.05 to 18 kPa, wherein the volume gas flows ($\dot{V}$) of the precursor gas mixtures (VG1, VG2) are so selected that the mean residence time (T) in the CVD reactor is less than 1 second.

22. A process according to claim 21, wherein the volume gas flows ($\dot{V}$) of the precursor gas mixtures (VG1, VG2) are so selected that the mean residence time (T) in the CVD reactor is less than 0.5 second.

23. A process according to claim 21, wherein at least one of the process temperature in the CVD reactor is in the range of 625° C. to 800° C. and the process pressure in the CVD reactor is in the range of 0.05 to 8 kPa.

24. A process according to claim 21, wherein the ratio of the volume gas flows ($\dot{V}$) of the precursor gas mixtures (VG1, VG2) ($\dot{V}(VG1)/\dot{V}(VG2)$) is less than 1.5.

25. A tool according to claim 1, further comprising, arranged between the base body and the $Ti_{1-x}Al_xC_yN_z$ layer, at least one further carbide layer of a thickness of 0.05 μm to 7 μm, selected from a TiN layer, a TiCN layer deposited by means of high temperature CVD (CVD) or medium temperature CVD (MT-CVD), an $Al_2O_3$ layer and combinations thereof and/or arranged over the $Ti_{1-x}Al_xC_yN_z$ layer is at least one $Al_2O_3$ layer of the modification $\gamma$-$Al_2O_3$, $\kappa$-$Al_2O_3$ or $\alpha$-$Al_2O_3$.

26. A tool according to claim 1, further comprising, arranged between the base body and the $Ti_{1-x}Al_xC_yN_z$ layer, at least one further carbide layer of a thickness of 0.05 μm to 7 μm, selected from a TiN layer, a TiCN layer deposited by means of high temperature CVD (CVD) or medium temperature CVD (MT-CVD), an $Al_2O_3$ layer and combinations thereof and/or arranged over the $Ti_{1-x}Al_xC_yN_z$ layer is an $\alpha$-$Al_2O_3$ layer, wherein the $Al_2O_3$ layer is deposited by means of high temperature CVD (CVD) or medium temperature CVD (MT-CVD).

* * * * *

UNITED STATES PATENT AND TRADEMARK OFFICE
CERTIFICATE OF CORRECTION

PATENT NO. : 10,214,810 B2  
APPLICATION NO. : 15/112899  
DATED : February 26, 2019  
INVENTOR(S) : Dirk Stiens, Thorsten Manns and Sakari Ruppi Page 1 of 1

It is certified that error appears in the above-identified patent and that said Letters Patent is hereby corrected as shown below:

In the Claims

Claim 1, Column 14, Line 9: "$0.70<x<1, 0<y<0.25$ and $075<z<1.15$" should read --$0.70 \leq x<1, 0 \leq y<0.25$ and $0.75 \leq z<1.15$--.

Signed and Sealed this  
Eighth Day of December, 2020

Andrei Iancu  
*Director of the United States Patent and Trademark Office*